United States Patent
Mimis et al.

(10) Patent No.: US 10,063,196 B2
(45) Date of Patent: Aug. 28, 2018

(54) POWER AMPLIFIER

(71) Applicant: KABUSHIKI KAISHA TOSHIBA, Tokyo (JP)

(72) Inventors: Konstantinos Mimis, Bristol (GB); Gavin Watkins, Bristol (GB)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 15/505,325

(22) PCT Filed: Oct. 8, 2014

(86) PCT No.: PCT/GB2014/053030
§ 371 (c)(1),
(2) Date: Feb. 21, 2017

(87) PCT Pub. No.: WO2016/055754
PCT Pub. Date: Apr. 14, 2016

(65) Prior Publication Data
US 2017/0244369 A1    Aug. 24, 2017

(51) Int. Cl.
*H03F 3/191* (2006.01)
*H03F 1/56* (2006.01)
*H03F 3/24* (2006.01)
*H03F 3/21* (2006.01)

(52) U.S. Cl.
CPC .............. *H03F 1/565* (2013.01); *H03F 3/21* (2013.01); *H03F 3/24* (2013.01); *H03F 2200/387* (2013.01); *H03F 2200/423* (2013.01); *H03F 2203/21139* (2013.01)

(58) Field of Classification Search
CPC .......... H03F 3/189; H03F 3/191; H03F 1/565
USPC ................................................. 330/302, 305
See application file for complete search history.

(56) References Cited

U.S. PATENT DOCUMENTS

| | | | |
|---|---|---|---|
| 5,778,308 A * | 7/1998 | Sroka | H03H 7/40 333/17.3 |
| 5,808,527 A | 9/1998 | De Los Santos | |
| 6,522,201 B1 * | 2/2003 | Hsiao | H03G 1/0088 330/124 R |
| 7,332,980 B2 | 2/2008 | Zhu et al. | |

OTHER PUBLICATIONS

Andersson et al., "Theory and Design of Class-J Power Amplifiers With Dynamic Load Modulation," IEEE Transactions on Microwave Theory and Techniques (Dec. 2012), 60:3778-86.

* cited by examiner

*Primary Examiner* — Steven J Mottola
(74) *Attorney, Agent, or Firm* — Finnegan, Henderson, Farabow, Garrett & Dunner, L.L.P.

(57) ABSTRACT

A power amplifier comprising an amplifying element for amplifying a signal input to the amplifier, a matching network for varying the reactance presented to the output of the amplifying element at the fundamental frequency of the input signal, the matching network being switchable between first and second operating configurations, wherein in the first operating configuration, a net inductive reactance is presented to the output at the fundamental frequency and in the second operating configuration, a net capacitive reactance is presented to the output at the fundamental frequency.

12 Claims, 11 Drawing Sheets

POWER AMPLIFIER

FIELD

Embodiments described herein relate generally to a power amplifier.

BACKGROUND

In recent years, dynamic load modulation (DLM) has seen increased interest as a method for enhancing the efficiency and/or linearity of power amplifiers (PAs). In DLM a tuneable impedance matching network is used to present a number of distinct or variable impedances to the transistor device of the PA in a controllable and repeatable way. For this purpose, a number of tuneable components such as varactor diodes, FETs, pin diodes or MEMS devices are used.

In its simplest form, dynamic load modulation can achieve high efficiency through simple reactive load tuning i.e. tuning the output matching network of a PA. However, this technique can suffer from a drop in the efficiency characteristics between peak and back-off output power, as well as offering limited output power and an impedance matching that is difficult to realise in practice. An additional issue encountered when using DLM is the losses of the tuneable matching network.

A simplified version of DLM has been introduced in which only the reactive part of the load is modulated (reactive-DLM). This is particularly interesting as it simplifies the output matching network design and minimises its losses. However, this technique suffers from a lower efficiency improvement capability, resulting in a trade-off between efficiency and the complexity of the network.

BRIEF DESCRIPTION OF FIGURES

Embodiments of the invention will now be described by way of example with reference to the accompanying drawings in which.

DETAILED DESCRIPTION

Figure 1:
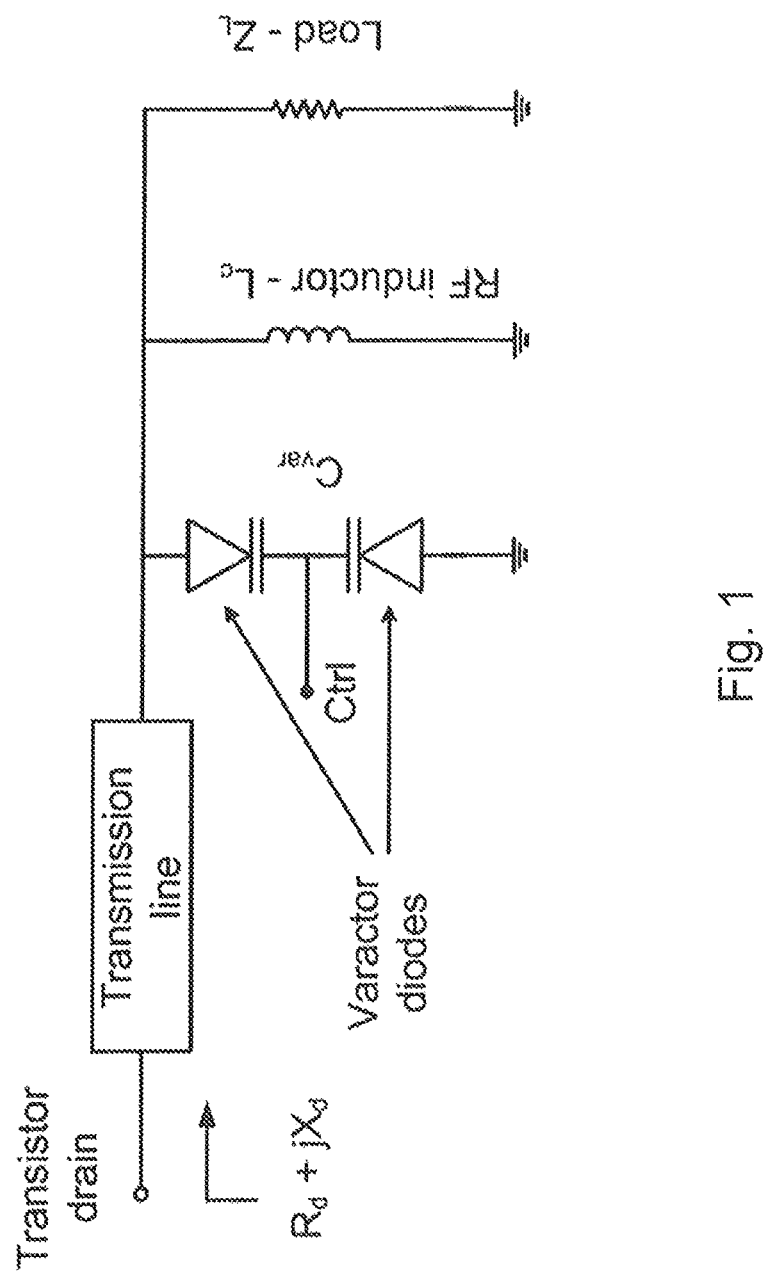
FIG. 1 shows a tuneable matching network architecture for dynamic load modulation of a power amplifier.

According to a first embodiment, there is provided a power amplifier comprising:
   an amplifying element for amplifying a signal input to the amplifier,
   a matching network for varying the reactance presented to the output of the amplifying element at the fundamental frequency of the input signal,
   the matching network being switchable between first and second operating configurations, wherein in the first operating configuration, a net inductive reactance is presented to the output at the fundamental frequency and in the second operating configuration, a net capacitive reactance is presented to the output at the fundamental frequency.

The matching network may be configured such that the resistance presented to the output of the amplifying element remains constant in both the first and second operating configurations.

The power amplifier may comprise a switching arrangement for switching the matching network between the first and second operating configurations. The switching arrangement may be operable to vary the reactance across a range of values in both the first and second operating configurations. In some embodiments, the reactance is continuously variable in both the first and second operating configurations.

The switching arrangement may comprise a single element that is operable to switch between the first and second operating configurations and to vary the reactance within each of the first and second operating configurations.

In some embodiments, the switching arrangement includes a switching element for switching between the first and second operating configurations and a tuneable element for varying the reactance within the first and second operating configurations.

In some embodiments, the element used to switch between the first and second operating configurations may be a variable inductor or variable capacitor.

The switching arrangement may be configured to switch between the first operating configuration and second operating configuration dependent on the output power back-off of the amplifier. The switching arrangement may be configured to switch from the first operating configuration to the second operating configuration when the output power back-off is at a first value and to switch from the second operating configuration to the first operating configuration when the output power back-off is at a second value that is higher than the first value.

In some embodiments, the matching network includes an arrangement for varying the reactance presented to the output of the amplifying element at a second harmonic of the fundamental operating frequency of the input signal.

The arrangement for varying the reactance presented at the second harmonic may comprise an injection network for injecting a signal at the second harmonic of the input signal frequency into the matching network.

The arrangement for varying the reactance presented at the second harmonic may comprise a tuneable transmission line, the length of the transmission line being adjustable to set the magnitude of the second harmonic reactance.

The arrangement for varying the reactance presented at the second harmonic may comprise one or more stubs loaded with variable capacitors.

In some embodiments, the power amplifier is configured such that when the amplifier is in the first operating configuration, a net capacitive reactance is presented to the output of the amplifying element at the second harmonic frequency and when the power amplifier is in the second operating configuration, a net inductive reactance is presented to the output of the amplifying element at the second harmonic frequency.

FIG. 1 shows a commonly used tuneable matching network architecture for dynamic load modulation of a power amplifier. The signal that is to be amplified is input to the amplifier and the tuneable matching network is used to vary the reactance presented at the output of the amplifying element (in this case, a transistor) at the fundamental frequency of that input signal. The input signal may be, for example, a carrier wave signal that is to be broadcast as a radio wave following its amplification. As shown, the tuneable matching network includes two anti-series varactor diodes and an RF inductor that can be used to vary the reactance presented at the output of the transistor.

Figure 2:
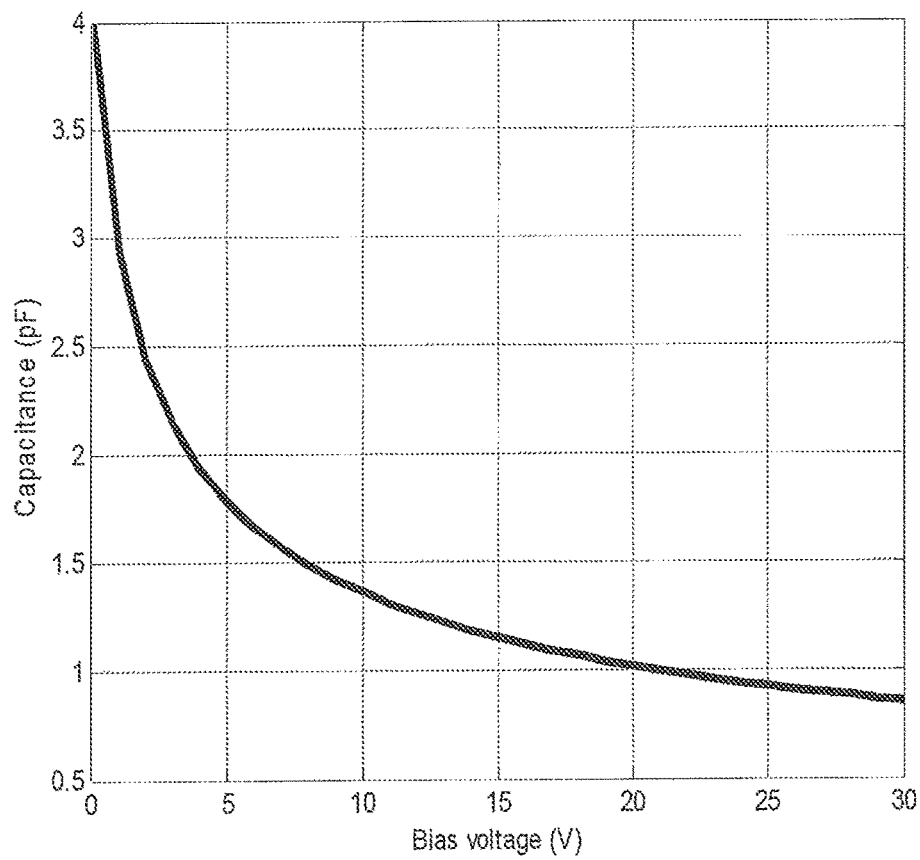
FIG. 2 shows a graph of the capacitance offered by a typical abrupt junction varactor diode as a function of bias voltage range.
Figure 3:
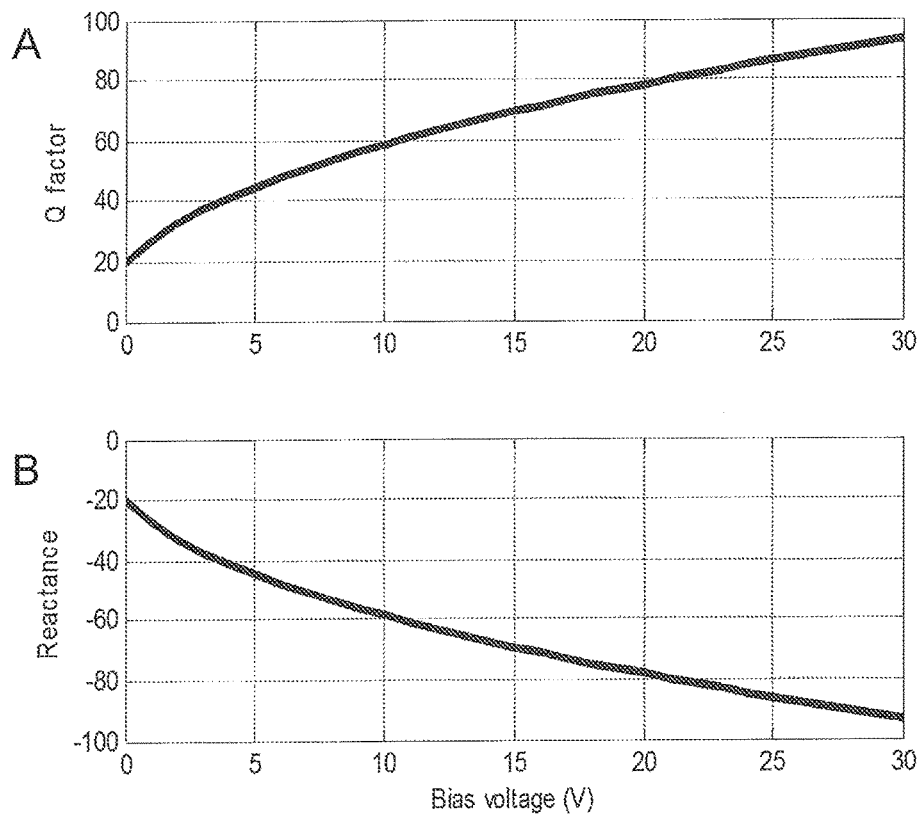
FIG. 3 shows the observed Q factor and reactance at 2 GHz for a varactor with an "on" resistance of approximately 0.5Ω.

One of the core limitations of dynamic load modulation is the losses of the tuneable matching network. These losses depend on the type of matching network used and the tuneable components chosen. Due to the finite quality (Q) factor of these components, the losses of the matching network will vary over its tuneable range. As an example, the capacitance offered by a typical abrupt junction varactor diode over its bias voltage range is plotted in FIG. 2. FIGS. 3A and 3B show, respectively, the observed Q factor and reactance at 2 GHz for a varactor with an "on" resistance of approximately 0.5Ω (typical value).

In reactive load modulation, and load modulation in general, the matching network losses are high at the output power back-off region. This leads to excess power dissipation in the matching network and so even though the transistor efficiency remains high, the system efficiency degrades. To illustrate this point, if the DC-to-RF efficiency is defined as $P_{TRout}/P_{DC}$ for an ideal matching network, where $P_{TRout}$ is the output power from the transistor and $P_{DC}$ is the DC input power, then when the losses for the matching network $P_{MNloss}$ are taken into account, the DC-to-RF efficiency now becomes $(P_{TRout}-P_{MNloss})/P_{DC}$.

Embodiments described herein can help to improve the back-off efficiency of dynamic load modulation power amplifiers (DLM PAs) and more specifically reactively DLM PAs by minimising the losses ($P_{MNloss}$) of the output tuneable matching network.

In embodiments described herein, the matching network losses can be reduced by exploiting complementary modes of PA operation such as Class-J/J* and continuous Class-F/ $F^{-1}$, which rely on harmonic tuning to achieve high efficiency.

In an example embodiment, a tuneable matching network based on that shown in FIG. 1 is used. The length and characteristic impedance of the transmission line is adjusted so that only the load's reactance is modulated, while its resistance is fixed. The RF inductor of FIG. 1 is replaced by a variable RF inductor, whose inductance $L_C$ may be switched between different values; in doing so, the variable RF inductor provides a switching arrangement that can be used to switch between first and second operating configurations, where in the first operating configuration, a net inductive reactance is presented to the output of the transistor and in the second operating configuration, a net capacitive reactance is presented to the output of the transistor.

Figure 4:
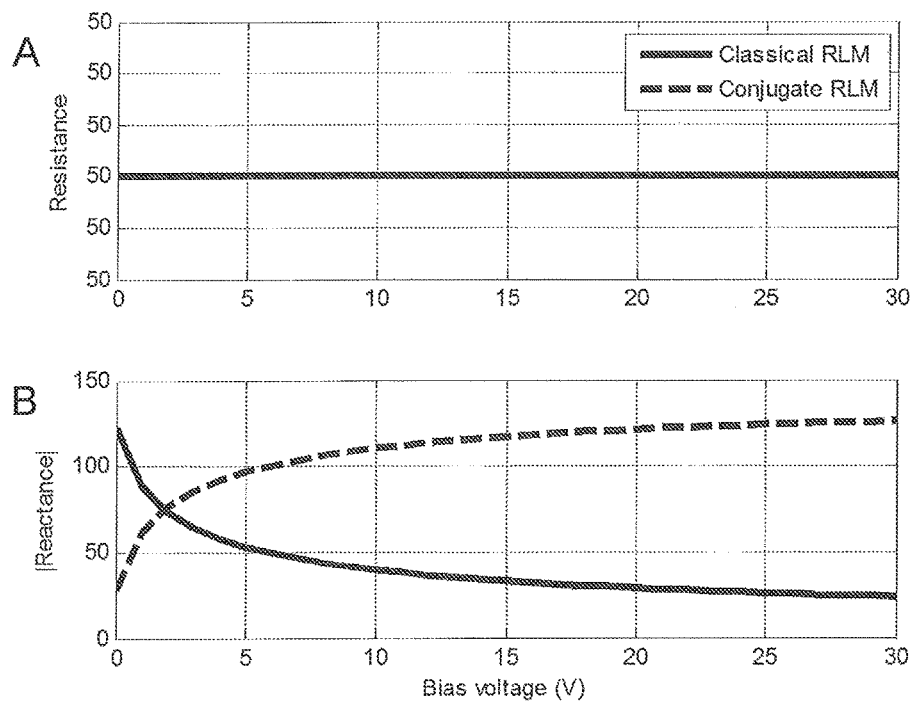
FIG. 4 shows examples of how the resistance and reactance of a tuneable matching network may vary as a function of bias voltage.

By appropriately choosing the value of $L_C$ the tuneable range of the reactance can be controlled; FIGS. 4A and 4B show examples of how the resistance and reactance of the matching network may vary as a function of bias voltage, for two different values of $L_C$. The solid line ("classical reactive LM") shows a modulated inductive load (the reactance has a positive sign), while the dashed line ("conjugate reactive LM") represents a capacitive modulated load (negative sign of reactance).

Figure 5:
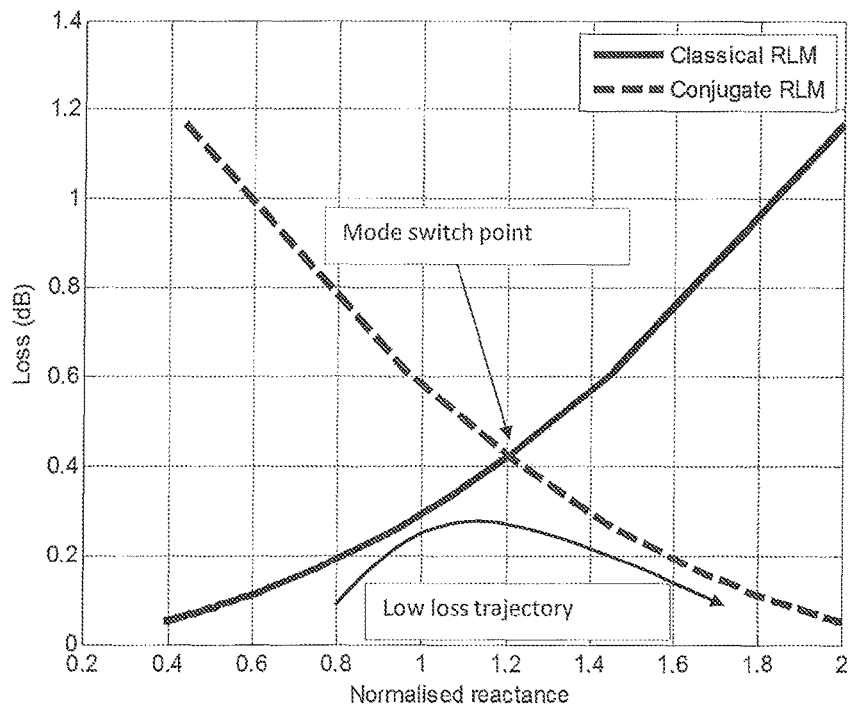
FIG. 5 shows an example of the loss experienced by two tuneable matching networks using a modulated inductive load and a capacitive modulated load, respectively.

The main difference between the two types of reactive modulation described above is the inherent losses in the tuneable matching network. FIG. 5 shows an example of the loss experienced by two networks using a modulated inductive load (classical RLM) and a capacitive modulated load (conjugate RLM), respectively. It is apparent from FIG. 5 that the losses of matching networks employing these two types of load modulation are complementary over the tuneable range i.e. they have their minimum and maximum loss for different amplitudes of reactance. By adding some additional flexibility to the tuneable matching network, a hybrid-mode reactive load modulated PA can be designed so that the matching network losses are kept to a minimum over the output power dynamic range of the amplifier. This flexibility translates to a network that will be able to modify the value of $L_C$ between two discrete values in order to move from inductive load modulation to capacitive load modulation. In some embodiments, it may also be possible to modify the second harmonic (and/or higher harmonics) termination impedance of the network, again between two values, to match the fundamental load modulation with the appropriate second harmonic termination. In this way, the tuneable matching network losses can be minimised either at peak output power or back-off.

In some embodiments, the first and second operating configurations may define complementary modes of operation (e.g. Class-B/J and B/J* or Class-B/F and B/F* etc). Complementary modes of operation like Class J and J* achieve the same efficiency and output power even under load-modulation with the only difference being that the impedance terminations they require are the conjugate of each other as shown in Table 1 below.

TABLE 1

Impedances for Class-J/J* amplifiers

| Class | Impedances | |
|---|---|---|
| | Fundamental | Second harmonic |
| J | $R_J + R_Ji$ | $-1.2R_Ji$ |
| B | $R_J$ | short |
| J* | $R_J - R_Ji$ | $1.2R_Ji$ |

Figure 6:
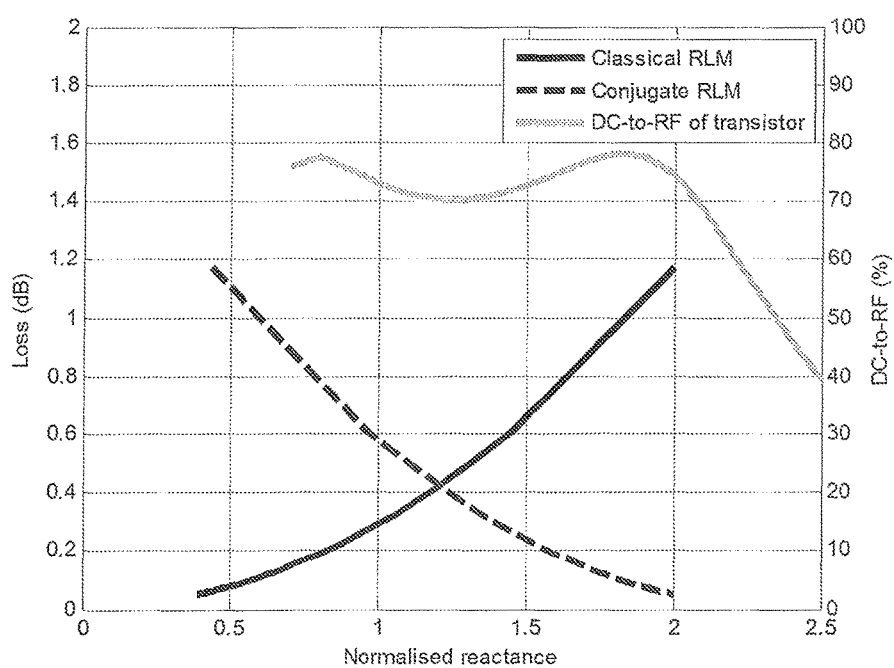
FIG. 6 shows a graph of DC to RF conversion efficiency as a function of the normalised reactance for amplifiers employing class J and class J* modes of operation, whilst neglecting any matching network losses under load modulation.

FIG. 6 shows the DC-RF efficiency as a function of the normalised reactance for amplifiers employing class J and class J* modes of operation, whilst neglecting any matching network losses under load modulation. For both class J (classical RLM) and class J* (conjugate RLM) modes, the DC-to-RF efficiency of the transistor is the same, as is the output power delivered. The losses associated with each mode are also plotted over the reactance they are able to present.

Figure 7:
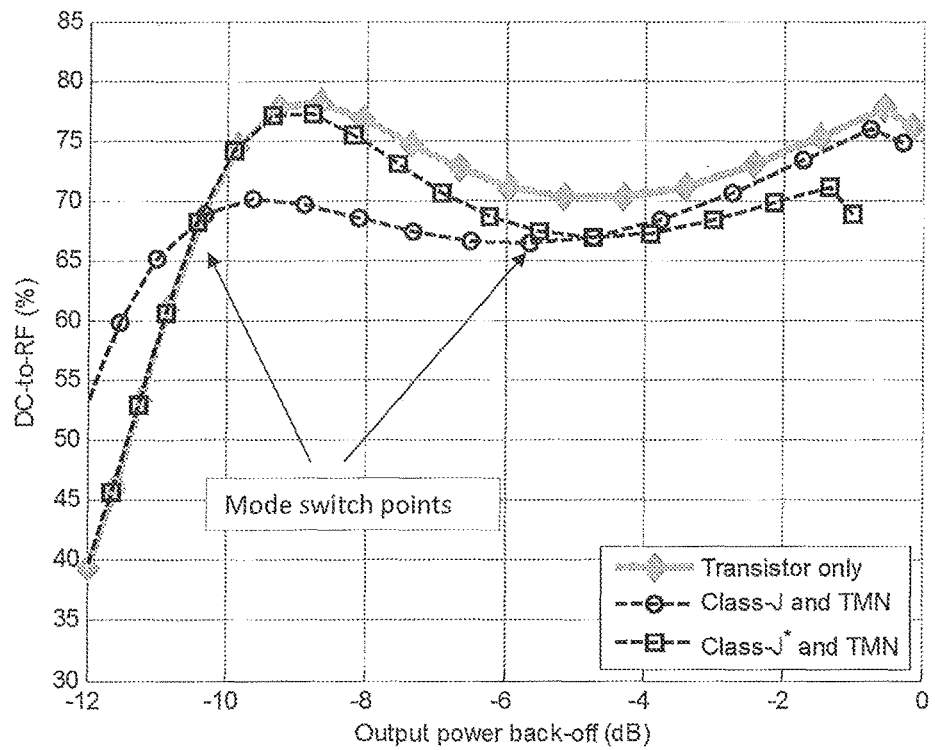
FIG. 7 shows the efficiency of a power amplifier employing dynamic load modulation plotted as a function of output power for an ideal tuneable matching network and for lossy tuneable matching networking operating in the Class J and Class J* modes.

FIG. 7 shows the DLM PA efficiency plotted as a function of output power for an ideal tuneable matching network (triangle marker) and for lossy tuneable matching network operating in the Class J and Class J* modes (circle and square markers, respectively). It can be seen that where the load is modulated from Class-B towards J (circle marker), the maximum efficiency is achieved at between 0-2 dB output power back-off, due to the small loses of the network at that point, but at 9-10 dB output power back-off the efficiency drops, due to the high losses of the network at that point. Conversely, if the load is modulated between Class-B and J* (square marker) low losses are achieved at the 9-10 dB output power back-off, but the high loss of the network at peak output power restricts the system's ability to exploit the full output capabilities of the transistor, reducing the overall power that is delivered by the amplifier.

Embodiments described herein allow the power amplifier to alter its mode of operation dynamically over its dynamic range in order to increase the load modulated efficiency. In embodiments described herein, the matching network is designed in such a way that it can toggle between the two "states" or modes of operation (i.e. Class-B to J and B to J*). The network can switch the harmonic terminations between two values and the fundamental termination between the inductive and capacitive plane. In such a system the network losses can be reduced and for each output power level the highest efficiency available from the two modes can be achieved. FIG. 7 shows the potential switching points for switching from one mode to the other; by switching between the modes at the points indicated, it is possible to combine the lower losses of the network in one mode with the higher back-off efficiency of the other mode.

Thus, embodiments described herein can offer an efficiency enhancement in the output power back-off region. Such a feature is particularly beneficial for the amplification of signals with high peak to average power ratios (PAPR). The enhancement in performance will depend on a number of factors including, for example, the type of the amplified signal, the PA modes chosen, the centre operational frequency of the PA, the architecture of the matching network etc.

The power amplifier may be configured to switch between each operating configuration whilst still being able to vary the reactance presented to the output of the amplifying element within each operating configuration i.e. the matching network may be configured to vary the reactance presented to the output of the amplifying element at the fundamental frequency in both the capacitive and inductive planes. The tuning of the reactance within each operating configuration may be implemented using the same element used to switch between the two operating configurations. For example, if a tuneable element such as a varactor is used to vary the reactance in the first and second operating configurations and that tuneable element has a sufficiently large tuneable ratio, the tuneable element may itself be controlled to modulate the load from the inductive to the capacitive plane without switching of additional elements. In other embodiments, a separate switching element such as a variable capacitor or inductor may be used to effect the switch between the first and second operating configurations, with additional tuneable components being employed to vary the reactance within each operating configuration.

By minimising the losses of the tuneable matching network, the power output of the amplifier can be improved together with the back-off efficiency.

Due to the non-linear nature of most tuneable components (FETs, diodes etc), the matching network may introduce an extra non-linearity during load modulation. Embodiments described herein can help to improve the linearity of the matching network either in addition to, or instead of, reducing its losses, so helping to increase the overall linearity of the amplifier. Embodiments may also be used to optimise the load modulation phenomenon at two different frequencies for a dual-band amplifier system, rather for the reducing the losses of the matching network. Four practical examples of how such a system could be implemented are given in FIGS. 8, 9, 10 and 11.

Figure 8:
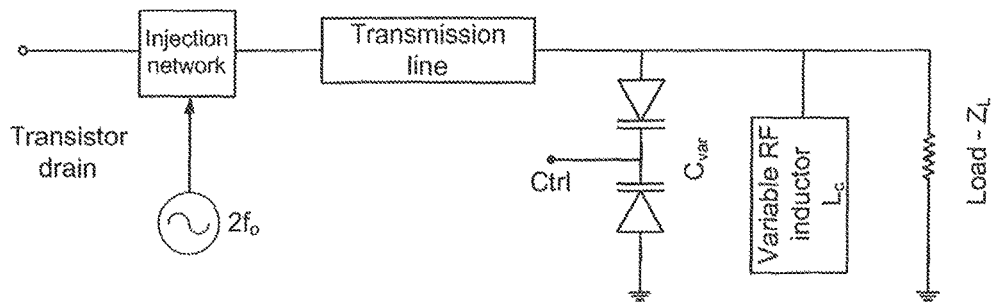
FIG. 8 shows an example of a tuneable matching network implemented using harmonic injection for second harmonic control according to an embodiment.

FIG. 8 shows an example of a tuneable matching network implemented using harmonic injection for second harmonic control. In the matching network of FIG. 8, a three port injection network is used to inject a second harmonic signal to set the second harmonic termination to the appropriate level, whereas the rest of the network load-modulates the fundamental termination accordingly. To achieve the switch between first and second operating configurations, the appropriate value of $L_C$ is chosen to set the load modulation in the capacitive or inductive plane. Based on that a second harmonic signal of appropriate magnitude and phase is injected to set the second harmonic termination to the right value (inductive or capacitive, respectively). The three port network can be realised as an RF multiplexer, or another frequency selective network, for example.

Figure 9:
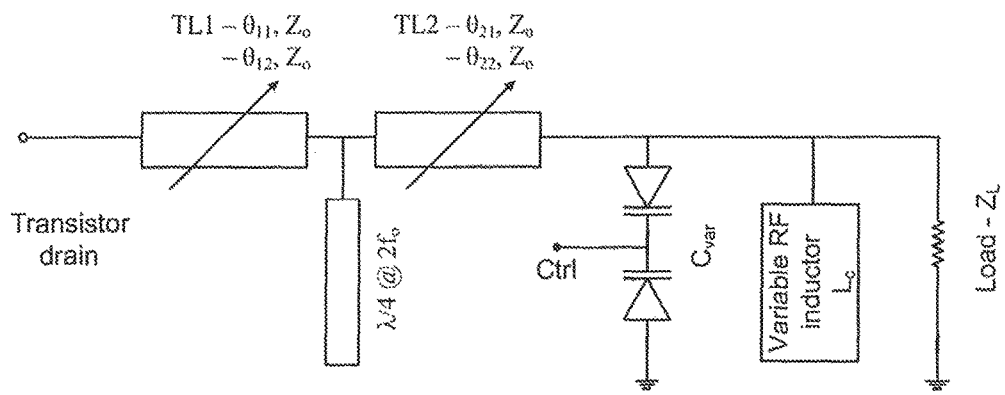
FIG. 9 shows an example of a tuneable matching network implemented for second harmonic control using tuneable transmission lines according to an embodiment.

FIG. 9 shows an example of a tuneable matching network implemented for second harmonic control using tuneable transmission lines. Here, the matching network utilises a second harmonic trap network in which the first transmission line length is used to set the magnitude of the second harmonic reactance and sign, while the second transmission line length is selected to ensure that only the reactive part of the load is modulated at the fundamental frequency using the varactors (or other tuneable element). Tuneable transmission lines are used and can be implemented in a number of ways. The transmission lines can be continuously tuneable, or alternatively may toggle between two chosen electrical lengths and/or characteristic impedance values.

Figure 10:
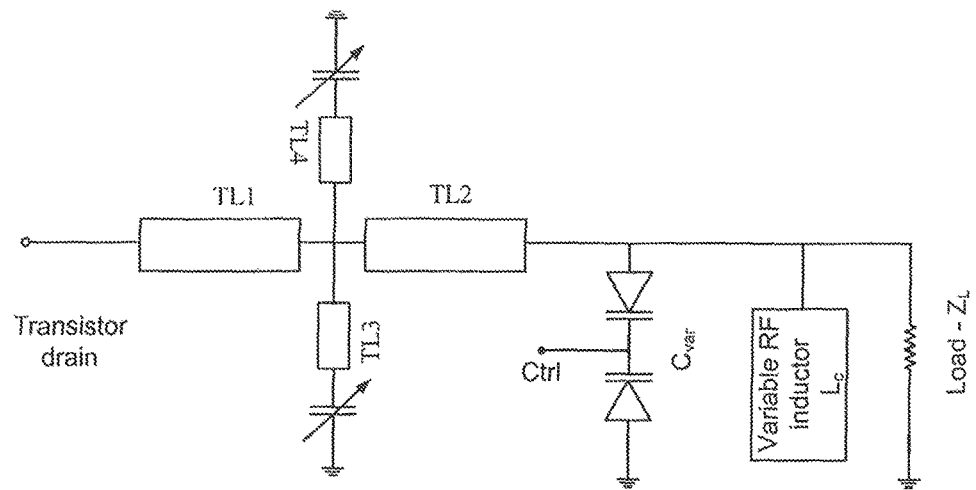
FIG. 10 shows an example of a tuneable matching network implemented for harmonic and fundamental impedance control according to an embodiment.

FIG. 10 shows an example of a tuneable matching network implemented for harmonic and fundamental impedance (reactance) control in another embodiment. In this case, the matching network uses stubs loaded with variable capacitors in order to control the harmonic terminations, with the fundamental impedance (reactance) being controlled by the rest of the network.

Figure 11:
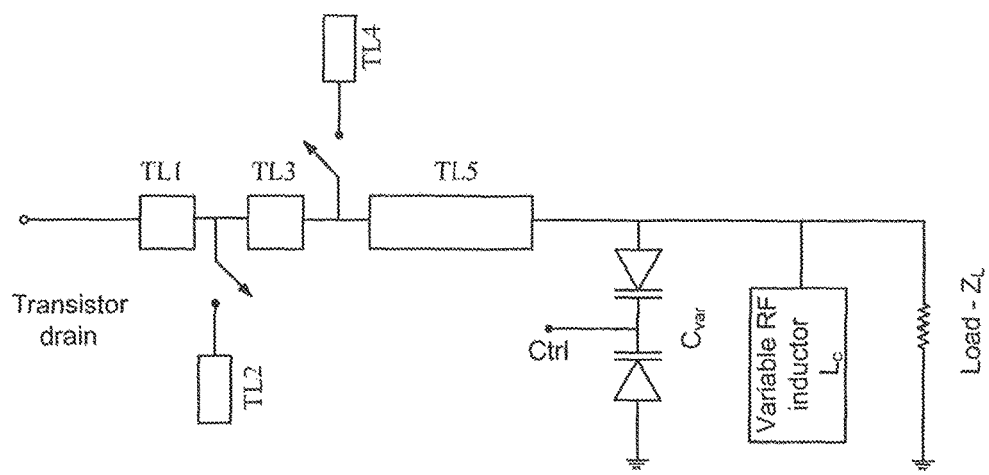
FIG. 11 shows a tuneable matching network implemented for harmonic and fundamental impedance control using switches according to an embodiment.

FIG. 11 shows a tuneable matching network implemented for harmonic and fundamental impedance (reactance) control using switches in another embodiment. Here, the matching network switches in and out quarter wavelength lines TL2, TL4 to realise multiple second harmonic terminations while the fundamental match is achieved by the second part of the network. All the switches can be controlled by a single signal.

Each one of the matching networks shown in FIGS. 8 to 11 can be implemented either with shorted or open stubs by appropriate modifications.

Figure 12:
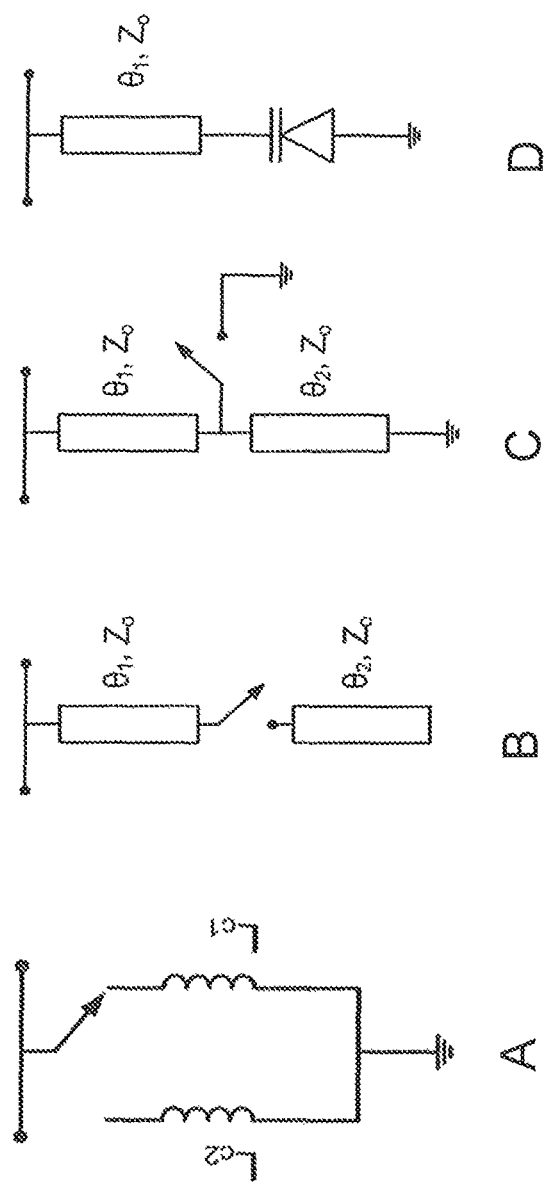
FIG. 12 shows alternative switching arrangements for effecting the switch between first and second operating configurations of a tuneable matching network in embodiments discussed herein.

FIG. 12 shows alternative switching arrangements for effecting the switch between first and second operating configurations of a tuneable matching network in embodiments discussed herein. As shown, the $L_C$ value control that is used to effect the switch between the first and second operating configurations (i.e. to switch between the capacitive and inductive plane at the fundamental frequency) can be implemented by a SPDT switch and two inductors of different values (FIG. 12A). Alternatively, the value of $L_C$ can be controlled by an SPST switch and two transmission line stubs of appropriate electrical lengths as shown in FIGS. 12B, 12C. The SPST essentially increases and decreases the effective length of the stub controlling its equivalent inductance. The stubs can either be shorter or open. As shown in FIG. 12D, the switching arrangement may comprise a transmission line stub and varactor diode.

In some embodiments, the reactance presented at the output of the amplifying element at the second harmonic may be complementary to the reactance presented at the fundamental frequency; that is, when the amplifier is in the first operating configuration and the net reactance presented at the output of the amplifying element at the fundamental frequency is inductive, the second harmonic load may be capacitive in order to provide Class-B like performance at various output power levels (the higher harmonics being shorted). Similarly, when the amplifier is in the second operating configuration and the net reactance presented at the output of the amplifying element at the fundamental frequency is capacitive, the second harmonic load may be inductive. By controlling the second harmonic load in this way, non-linear distortion can be reduced, with a corresponding increase in efficiency and delivered output power.

Figure 13:
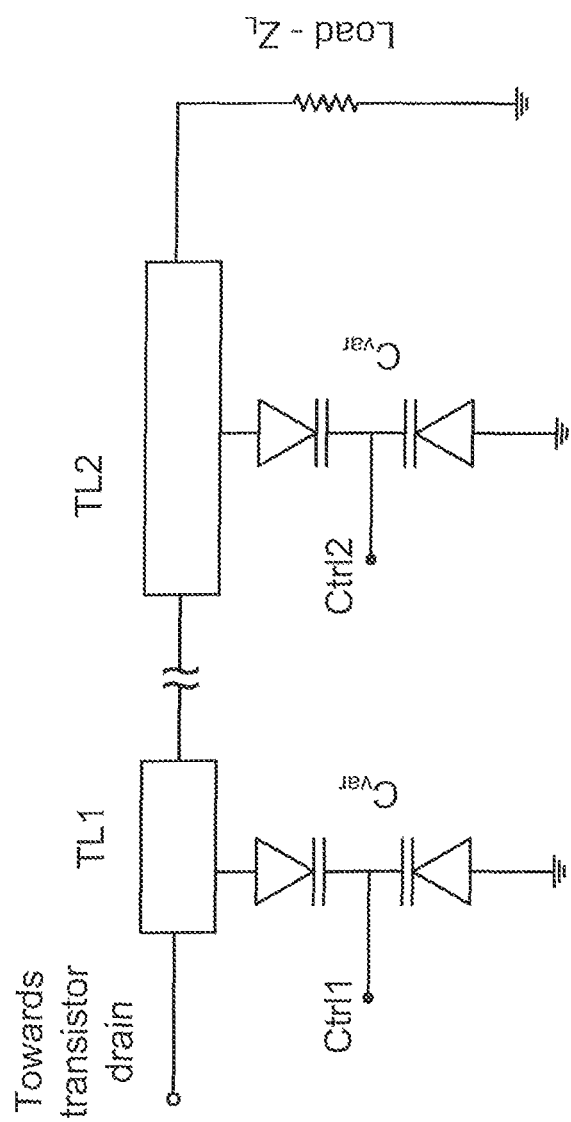
FIG. 13 shows an example of a tuneable matching network according to an embodiment.

FIG. 13 shows an example of a tuneable matching network that uses two tuneable elements at different points along a transmission line. Here, controls Ctrl1 and Ctrl2 are coordinated to modulate the impedance (reactance) at the fundamental frequency within the capacitive and inductive plane. Although not shown in FIG. 13, it is possible that an additional injection network (such as that shown in FIG. 8) could be provided between the transistor drain and the first transmission line TL1 in order to control the second harmonic termination. Additional elements may also be provided between the two transmission lines TL1 and TL2 to achieve the desired matching.

While certain embodiments have been described, these embodiments have been presented by way of example only, and are not intended to limit the scope of the invention. Indeed, the novel methods, devices and systems described herein may be embodied in a variety of forms. For example, in embodiments described above, different elements of the tuneable matching network are shown to be arranged in parallel with one another; whilst this is preferable for practical reasons, the same results can also be achieved by connecting those elements in series.

Various omissions, substitutions and changes in the form of the methods and systems described herein may be made without departing from the spirit of the invention. The accompanying claims and their equivalents are intended to cover such forms or modifications as would fall within the scope and spirit of the invention.

The invention claimed is:

1. A power amplifier comprising:
an amplifying element for amplifying a signal input to the amplifier,
a matching network for varying the reactance presented to the output of the amplifying element at the fundamental frequency of the input signal,
a switching arrangement for switching the matching network between first and second operating configurations, wherein in the first operating configuration, a net inductive reactance is presented to the output at the fundamental frequency and in the second operating configuration, a net capacitive reactance is presented to the output at the fundamental frequency,
wherein
the switching arrangement is configured to switch between the first operating configuration and second operating configuration dependent on the output power back-off of the amplifier; and
the switching arrangement is configured to switch from the first operating configuration to the second operating configuration when the output power back-off is at a first value and to switch from the second operating configuration to the first operating configuration when the output power back-off is at a second value that is higher than the first value.

2. A power amplifier according to claim 1 wherein the matching network is configured such that the resistance presented to the output of the amplifying element remains constant in both the first and second operating configurations.

3. A power amplifier according to claim 1 wherein the switching arrangement is operable to vary the reactance across a range of values in both the first and second operating configurations.

4. A power amplifier according to claim 3, wherein the reactance is continuously variable in both the first and second operating configurations.

5. A power amplifier according to claim 3, wherein the switching arrangement comprises a single element that is operable to switch between the first and second operating configurations and to vary the reactance within each of the first and second operating configurations.

6. A power amplifier according to claim 3, wherein the switching arrangement includes a switching element for switching between the first and second operating configurations and a tuneable element for varying the reactance within the first and second operating configurations.

7. A power amplifier according to claim 5 or 6 wherein the element used to switch between the first and second operating configurations is a variable inductor or variable capacitor.

8. A power amplifier according to claim 1, wherein the matching network includes an arrangement for varying the reactance presented to the output of the amplifying element at a second harmonic of the fundamental operating frequency of the input signal.

9. A power amplifier according to claim 8, wherein the arrangement for varying the reactance presented at the second harmonic comprises an injection network for injecting a signal at the second harmonic of the input signal frequency into the matching network.

10. A power amplifier according to claim 8, wherein the arrangement for varying the reactance presented at the second harmonic comprises a tuneable transmission line, the length of the transmission line being adjustable to set the magnitude of the second harmonic reactance.

11. A power amplifier according to claim 8, wherein the arrangement for varying the reactance presented at the second harmonic comprises one or more stubs loaded with variable capacitors.

12. A power amplifier according to claim 8, wherein the power amplifier is configured such that when the amplifier is in the first operating configuration, a net capacitive reactance is presented to the output of the amplifying element at the second harmonic frequency and when the power amplifier is in the second operating configuration, a net inductive reactance is presented to the output of the amplifying element at the second harmonic frequency.

\* \* \* \* \*